(12) United States Patent
Andreotti et al.

(10) Patent No.: US 7,420,430 B2
(45) Date of Patent: Sep. 2, 2008

(54) METHOD AND ARRANGEMENT FOR GENERATING AN OUTPUT CLOCK SIGNAL WITH AN ADJUSTABLE PHASE RELATION FROM A PLURALITY OF INPUT CLOCK SIGNALS

(75) Inventors: Claudio Andreotti, München (DE); Edoardo Prete, München (DE); Anthony Sanders, Haar (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/194,494

(22) Filed: Aug. 1, 2005

(65) Prior Publication Data
US 2006/0029172 A1    Feb. 9, 2006

(51) Int. Cl.
*H03B 28/00*    (2006.01)
(52) U.S. Cl. .......................... 331/74; 327/153; 327/161; 375/326
(58) Field of Classification Search .................. 331/74; 327/153, 161; 375/326
See application file for complete search history.

(56) References Cited

U.S. PATENT DOCUMENTS

| | | | |
|---|---|---|---|
| 6,417,712 B1 * | 7/2002 | Beards et al. ............... | 327/248 |
| 6,539,072 B1 * | 3/2003 | Donnelly et al. ............ | 375/371 |
| 6,831,497 B2 * | 12/2004 | Koh et al. .................... | 327/254 |
| 6,995,593 B2 * | 2/2006 | Cucchi et al. ................ | 327/238 |
| 6,995,617 B2 * | 2/2006 | Citta et al. ................... | 331/1 A |
| 7,057,450 B2 * | 6/2006 | Koike .......................... | 327/552 |
| 2003/0002607 A1 | 1/2003 | Mooney et al. | |

FOREIGN PATENT DOCUMENTS

| | | |
|---|---|---|
| EP | 0 909 035 A2 | 4/1999 |
| EP | 1 351 429 A1 | 10/2003 |

* cited by examiner

*Primary Examiner*—Robert J. Pascal
*Assistant Examiner*—James E Goodley
(74) *Attorney, Agent, or Firm*—Maginot, Moore & Beck

(57) ABSTRACT

Method and arrangement for generating an output clock signal with an adjustable phase relation from a plurality of input clock signals.

A method and an arrangement are provided for generating an output clock signal (o), in which a plurality of input clock signals (s, c) that have a predetermined phase relationship to one another, are weighted with respective weighting factors (A, 1-A), and in which the weighted input clock signals (s', c') are added in order to generate a summated clock signal (i). The summated clock signal (i) is integrated in an integrator (8) and optionally amplified in order to generate the output clock signal (o). An output clock signal (o) with an adjustable phase relation can be generated with such a method and such an arrangement, in which the requirements placed on the input clock signals are less stringent.

19 Claims, 4 Drawing Sheets

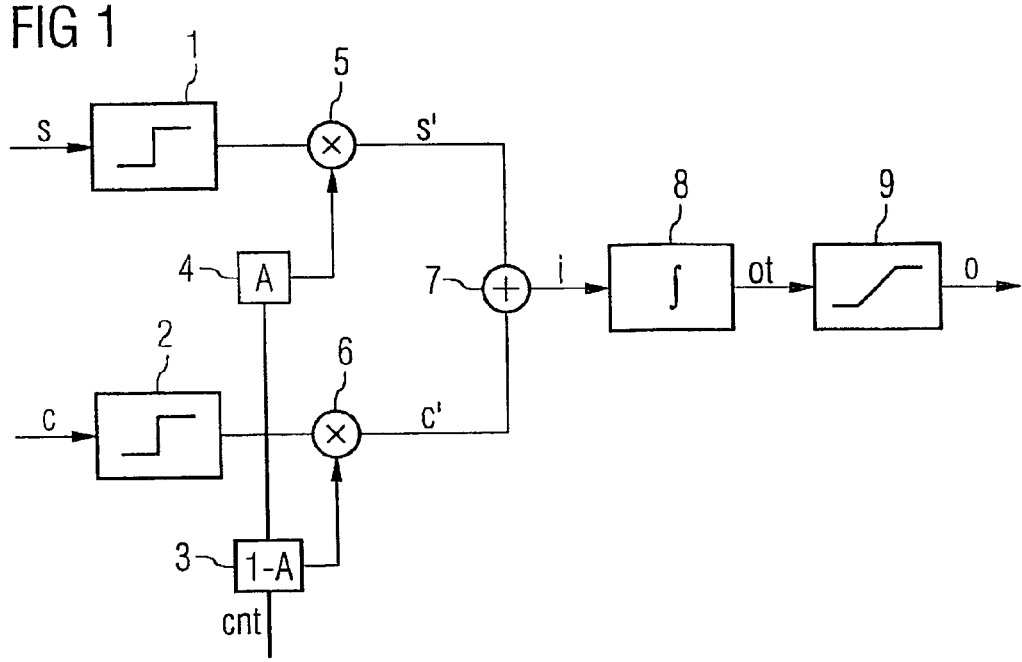
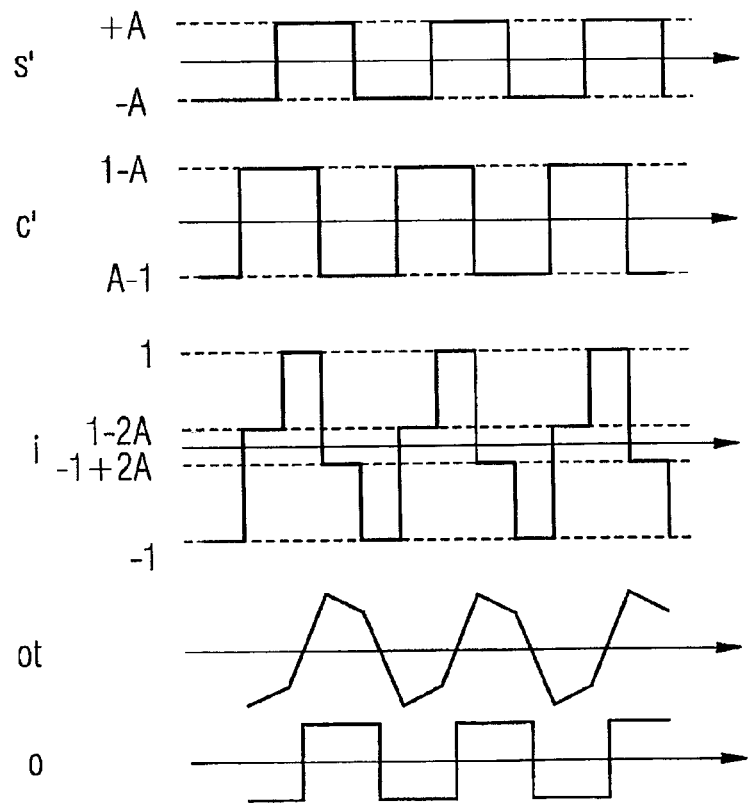

METHOD AND ARRANGEMENT FOR GENERATING AN OUTPUT CLOCK SIGNAL WITH AN ADJUSTABLE PHASE RELATION FROM A PLURALITY OF INPUT CLOCK SIGNALS

Method and arrangement for generating an output clock signal with an adjustable phase relation from a plurality of input clock signals

FIELD OF THE INVENTION

The present invention relates to a method and an arrangement for generating an output clock signal (clock pulse signal) that has an adjustable phase relation (phase angle). In particular the invention relates to a method and an arrangement for generating such a signal by means of a phase interpolator.

BACKGROUND

Phase interpolators are used to generate clock signals with an adjustable phase, which are used for example in communications devices within the context of clock and data recovery (CDR). Such phase interpolators are known for example from US 2003/0002607 A1 or from EP 0 909 035 A2.

The mode of operation of such phase interpolators will be explained hereinafter with the aid of FIGS. 5-8.

FIG. 5 shows in this connection a block diagram of a phase interpolator 21. Two input clock signals s and c are in this connection fed to the phase interpolator 21. The input clock signals have the same frequency and amplitude as well as a phase difference of 90° ($\pi/2$). In addition a control signal cnt is fed to the phase interpolator 21. Depending on the control signal cnt the phase interpolator 21 generates from the input clock signals s and c an output clock signal o whose phase lies between the phases of the input clock signals s and c. Phase interpolators are also known in which the phase difference between the input clock signals s and c differs from 90°, or in which more than 2, in particular 4, input clock signals are used in order to be able to generate an output clock signal o that has an arbitrary phase between 0° and 360°. The action of the phase interpolator 21 is illustrated in time representation in FIG. 6. The input clock signals c and s have a phase difference 22 of for example 90°, and the output clock signal o has, with respect to the input clock signal c, a phase difference 23 that is adjusted depending on the control signal cnt.

This state of affairs is illustrated again in phase representation in FIG. 7. The arrows represent in this connection so-called phasors, and the direction of the arrow corresponds to the phase of the corresponding signal. The arrows are denoted by P(s), P(o) and P(c) for the phasors of the corresponding signal s, o and c. P(o) is in this connection a function f of the control signal cnt.

A circuit configuration of such a phase interpolator is shown diagrammatically in FIG. 8. This phase interpolator 21 is designed as a difference interpolator, in other words the input clock signals are difference signals with the components s, s and c, c, while the output clock signal is a difference signal with components o, o.

The input clock signals are in each case fed to a difference amplifier, wherein the difference amplifier for the input clock signal s, s includes transistors T5 and T6 and a power source 10, while the difference amplifier for the input clock signal c, c includes transistors T7 and T8 as well as a power source 11. The difference amplifiers comprise common output load resistors L1, L2, which results in a summation of the outputs of the difference amplifiers.

In FIG. 8 in addition reference numeral 17 denotes an earth potential and 18 denotes a further defined potential, for example a positive supply voltage.

The control signal cnt controls the power sources 10 and 11 in order to vary the currents Is and Ic generated by them. This may be achieved in such a way that the sum of the currents Is and Ic remains constant. By varying the currents Is and Ic a weighting of the input clock signals s, s and c, c is carried out, whereby the phase of the output clock signal o, o is altered.

Such known phase interpolators are based on the following equation:

$$A \cdot \sin(2\pi ft) + (1-A)\cos(2\pi ft) = \qquad (1)$$
$$\sqrt{2A^2 - 2A + 1} \cos\left(2\pi ft + \arctan\left(\frac{A}{1-A}\right)\right)$$

The formula (1) states that with two sinusoidal input clock signals with 90° phase difference ($\sin(2\pi ft)$ and $\cos(2\pi ft)$) of frequency f, which are weighted with weighting factors A and 1-A and added, an output clock signal is generated that has a phase difference of arctan (A/1-A) compared to the cosine input clock signal, arctan being in this connection the arc tangent. Similar formulae may be derived for sinusoidal input clock signals that have a phase difference that is not equal to 90°. The value of the weighting factor A is adjusted in FIG. 8 by the control signal cnt, in which connection the control signal cnt may be a digital or analogue signal.

Equation (1) applies however only to sinusoidal signals. If the input clock signals are not sinusoidal, the dependence of the adjusted phase on the control signal cnt and on the weighting factor A is virtually impossible to calculate. In addition, in this case the output clock signal o will have a distorted waveform. This applies all the more so the greater the energy of the input clock signals in higher harmonics (for example when considering the Fourier resolution).

Conventional phase detectors must therefore satisfy two conditions: on the one hand the difference pair of transistors T5, T6 and T7, T8 must be operated in a range that is as linear as possible, which influences the necessary biaser voltage and the required input amplitude of the input clock signals s, c. On the other hand the input clock signals must not have any substantial energy in higher order harmonics, in other words they must be sinusoidal or approximately sinusoidal.

A further requirement for highly versatile phase interpolators is that they can process input clock signals with different timing (clock pulse) frequencies.

A conventional phase interpolator with which these requirements can be met is illustrated diagrammatically in FIG. 9. In this connection the input clock signals s and c are first of all fed to a signal shaping device 24, which comprises a first filter 25 for the input clock signal c and a second filter 26 for the input clock signal s. These filters are designed so as to damp higher harmonic components in the input clock signals s and c, and to match the amplitudes of the input clock signals s and c in such a way that for example the difference pair of transistors of FIG. 8 can be operated in an at least approximately linear range. The filtered input clock signals $\underline{s}$ and $\underline{c}$ generated in this way are fed to the actual phase interpolator 27, which is shown here only diagrammatically. It may for example be realised substantially like the phase interpolator 21 of FIG. 8. As shown in FIG. 9, the filtered input clock signals $\underline{s}$ and $\underline{c}$ are multiplied in multipliers 28 and 29 with weighting factors A and 1-A, and are added in an adder 30, the value A being adjusted by the control signal cnt. The intermediate clock signal $\underline{o}$ formed in this way is then preferably fed to a third filter 31, in which remaining distortions, for example of the waveform, are damped in order to generate the output clock signal o.

The filters 25, 26 and 31 are in this connection relatively complicated in design and implementation and are therefore expensive. In addition the filters must be programmable if input clock signals with different frequencies are to be processed. Also, the first filter 25 and the second filter 26 must be tuned to one another in order to generate filtered input clock signals s and c that correspond as well as possible to the requirements of formula (1).

SUMMARY

An object of the present invention is accordingly to provide a method and an arrangement for generating an output clock signal by means of phase interpolation, in which the requirements placed on the input clock signals are less stringent and in particular square-wave signals can also be processed, wherein no complicated filters are necessary and wherein an operation with variable frequencies with good linear properties is possible. This object is achieved by a method according to claim 1 and an arrangement according to claim 14. The dependent claims define advantageous or preferred examples of implementation of the method and arrangement.

According to the invention, in order to generate an output clock signal with adjustable phase relation it is proposed to weight a plurality of input clock signals in general of the same frequency that have a predetermined phase relationship to one another with respective weighting factors to adjust the phase relation, to add the weighted input clock signals in order to generate a summated clock signal, to integrate the summated clock signal, and to generate the output clock signal depending on the integrated summated clock signal.

In this case it can be shown that the integrated summated clock signal has a phase in relation to the input clock signals that is substantially directly proportional, apart from a constant, to the respective weighting factors. In this connection square-wave signals in particular may also be used as input clock signals, which is not possible with conventional phase interpolators. An output clock signal with adjustable phase can thus be generated in a simple way with the method according to the invention.

To generate the output clock signal the integrated summated clock signal can be amplified. If an output clock signal with an approximately square waveform is required, this amplification is preferably carried out so that the output clock signal already assumes a saturation value at an integrated summated clock signal whose value lies substantially below a maximum value.

In particular there may be used two input clock signals or four input clock signals that have in each case a phase shift of 90° with respect to one another. In the case of two input clock signals an output clock signal with an arbitrary phase relation between the phase relations of the two input clock signals may then essentially be generated, and in the case of four input clock signals an output clock signal with an arbitrary phase relation can be generated.

The input clock signals can be formed from corresponding originating input signals of the same frequency with the predetermined phase relationship, wherein the sign of the originating input clock signals is formed in order to generate input clock signals with a square waveform, or wherein the originating input clock signals are amplified, optionally with low saturation.

This may be carried out for example by difference amplifiers associated with the respective input clock signals, the difference amplifiers comprising a difference pair of transistors whose switching point is chosen corresponding to the requirements. In particular the switching points may be chosen so that a current flows through the respective difference amplifier either via a first transistor of the difference pair or via a second transistor of the difference pair, i.e. the transistors work as switches. The transistors may in this connection be MOS transistors or bipolar transistors. The adjustment of the respective weighting factors is then carried out by controlling the power sources associated with the respective difference amplifiers.

The currents generated by the difference amplifiers are then added and can be integrated in particular for the integration of the integrated summated clock signal at a capacitor.

In addition a current balancing circuit may be provided for amplifying the currents emitted by the difference amplifiers.

Preferably a control unit is provided that regulates the currents in such a way that an integrator, for example the capacitor, does not become saturated when the summated clock signal is integrated.

BRIEF DESCRIPTION OF THE DRAWINGS

With the method according to the invention and the arrangement according to the invention output clock signals with adjustable phase relation can be generated, in which the requirements placed on the input clock signals as regards waveform and amplitude are less stringent. In addition, in the present invention the phase relation of the output clock signal depends linearly on the respective weighting factors, which permits a simpler control of the phase relation than does the arc tangent function from equation (1). Finally, the frequency of the input clock signals can vary over wide ranges without the functional capability being adversely affected. The invention is discussed in more detail hereinafter with the aid of preferred examples of implementation and with reference to the accompanying drawings, in which:

FIG. 1 is a functional block diagram of an example of implementation of the present invention, FIG. 2 shows by way of example signal progressions in the example of implementation of FIG. 1.

DETAILED DESCRIPTION

Figure 3:
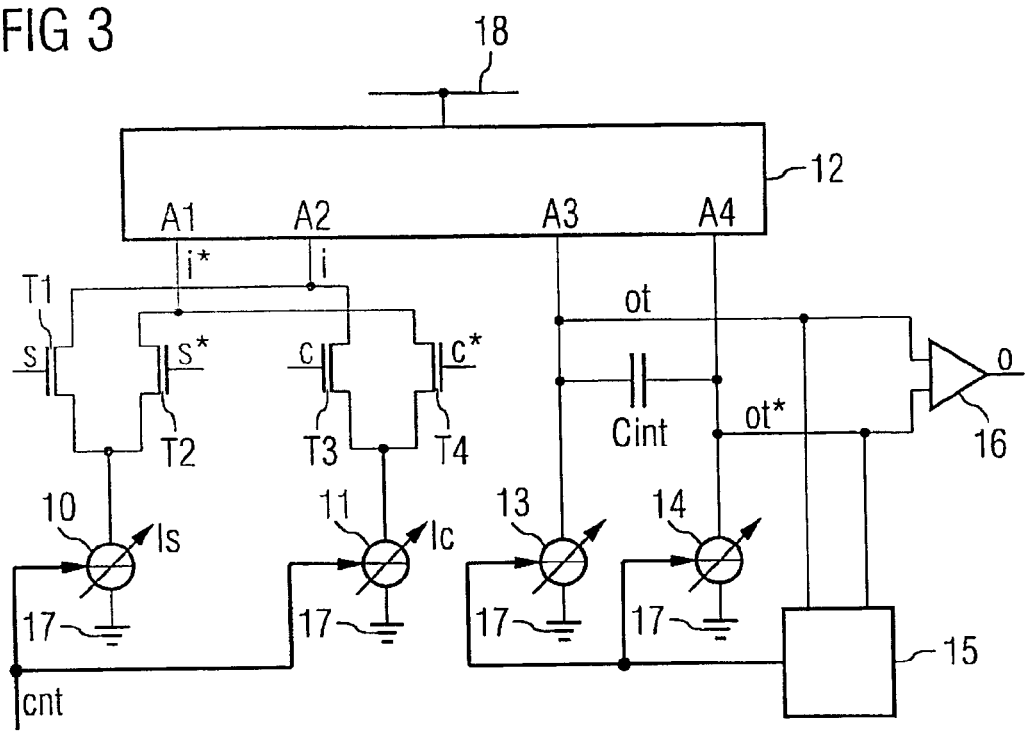
FIG. 3 shows a first circuit configuration of the present invention.

FIG. 1 shows a functional block diagram of an arrangement according to the invention for generating an output clock signal o. For this purpose a first input clock signal s and a second input clock signal c, which has the same frequency as the first input clock signal s, are fed to the arrangement. The first input clock signal s and the second input clock signal c preferably have a phase shift of 90° or π/2 with respect to one another. In principle however another phase shift between the first input clock signal s and the second input clock signal c is conceivable, whereby the range of the possible phase relations of the output starting signal o is altered. More than two input clock signals may also be used in order to cover a larger range. It is furthermore assumed that the first input clock signal s and the second input clock signal c oscillate around a value 0.

The input clock signals s, c with a predetermined phase difference may for example be generated in a known manner with a delay locked loop (DLL) of a polyphase filter arrangement, or with a quadrature oscillator.

The first input clock signal s is fed to a first sign block 1, which in the case of a positive value of the first input clock signal s emits a value of +1, and in the case of a negative value of the first input clock signal s emits a value −1. The second input clock signal c is correspondingly fed to a second sign block 2 that has the same functionality as the first sign block 1. Two square-wave signals with a phase difference of 90° are thus generated by the first sign block 1 and the second sign block 2, and are fed to multipliers 5 and 6. In these multipliers 5 and 6 the square-wave signals generated as described above are multiplied by weighting factors. In this connection the square-wave signal derived from the first input clock signal s is multiplied in the multiplier 5 by a weighting factor A, which is specified in a block 4 depending on a control signal cnt and lies between 0 and 1. The weighted input clock signal generated in this way is denoted s'. A weighting factor 1-A is generated in a corresponding way in a block 3 depending on the control signal cnt, the signal emitted by the sign block 2 being multiplied by the said weighting factor in the multiplier 6 in order to generate a weighted input clock signal c'. The timed progression of the signals s' and c' is illustrated by way of example in the top two lines of FIG. 2. In the illustrated example the phase of the second input clock signal c is ahead of the phase of the first input clock signal s by 90°, which produces a corresponding phase relation of the signals c' and s'. Furthermore, in the illustrated example the weighting factor A<0.5, with the result that the square-wave signal c' has a larger amplitude than the square-wave signal s'. The signals s' and c' are, as shown in FIG. 1, fed to an adder 7 in order to generate a summated clock signal i. This summated clock signal i is illustrated by way of example in the third line of FIG. 2. It can clearly be recognized that the summated clock signal i has a waveform that restricts its suitability as a clock signal. In particular, ascending sides of the summated clock signal i correspond either to ascending sides of the signal s' or of the signal c', so that here it is virtually impossible to fix a defined phase relation of the signal i dependent on the phase relations of the signals s' and c'.

The summated clock signal i is fed, as illustrated in FIG. 1, to an integrator 8 in order to generate an integrated summated clock signal ot. An integrated summated clock signal ot generated for the example of the summated clock signal i from FIG. 2 is likewise illustrated in FIG. 2. It can be shown that the zero passages of the integrated summated clock signal ot, which can serve as a measure of the phase relation of the summated clock signal ot, are displaced relative to the zero passages of the signal c' by a fixed phase shift plus a phase shift that is directly proportional to the weighting factor A. In other words $$P(ot)=P(c)+D+B \cdot A \qquad (2)$$

Here P(ot) denotes the phase relation of the integrated summated clock signal ot, P(c) denotes the phase relation of the second input clock signal c, which corresponds to that of the signal c', D denotes a constant offset and B denotes a proportionality constant.

If a corresponding application does not place strict requirements on the waveform of the output clock signal, then the integrated summated clock signal ot can be used directly as output clock signal. Preferably the integrated summated clock signal ot is fed however to an amplifier 9, which is designed so that it already becomes saturated at small positive or negative values of the integrated summated clock signal ot, for example at values whose absolute value exceeds 10% of the maximum absolute amplitude of the integrated summated clock signal ot. In this way an output clock signal o is generated that has approximately a square waveform, as illustrated in the bottom line of FIG. 2.

With the arrangement illustrated in FIG. 1 input clock signals s, c of substantially arbitrary waveform can be processed. If the input clock signals s, c have a square waveform or another suitable waveform, the sign blocks 1, 2 can be omitted. In the majority of the remaining cases the sign blocks 1 and 2 need not be ideal. Instead, in this case an amplifier that rapidly becomes saturated or even a linear amplifier is often sufficient. The sign blocks 1, 2 may however then also be configured as non-linearly as in the ideal case, i.e. they may have a stepped transmission function. This means a large degree of freedom in the design of these blocks, which distinguishes the present invention substantially from the design requirements of the conventional phase interpolator described in the introduction to the description. If the input clock signals s and c do not oscillate around 0, i.e. they do not have an average value of 0, this can be taken into account in the sign block 1, 2 by comparison with a corresponding threshold value. The arrangement may however also be operated directly with such input clock signals provided with an offset if it is desired to generate an output clock signal that likewise has a corresponding offset. A desired offset of the output clock signal o may however also be adjusted by simple addition or subtraction of a corresponding voltage.

In the above explanations the signals s, c are so-called single-ended signals. As is shown hereinafter with the aid of more specific circuit configurations, these signals may however also be difference signals.

Figure 8:
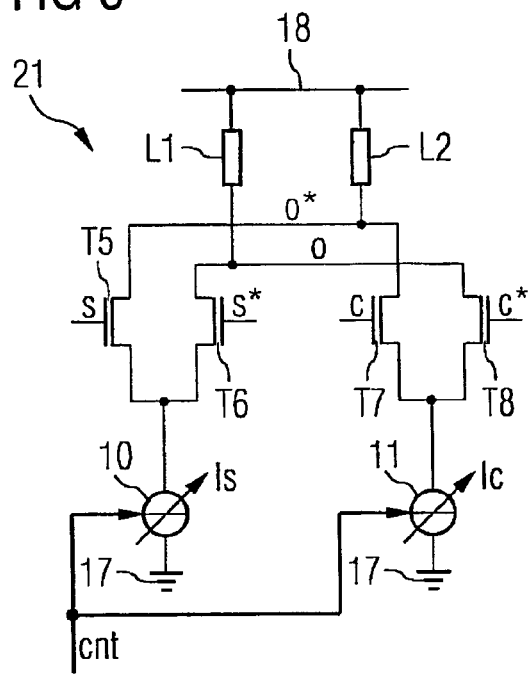
FIG. 8 is a circuit configuration of a conventional phase interpolator.
Figure 9:
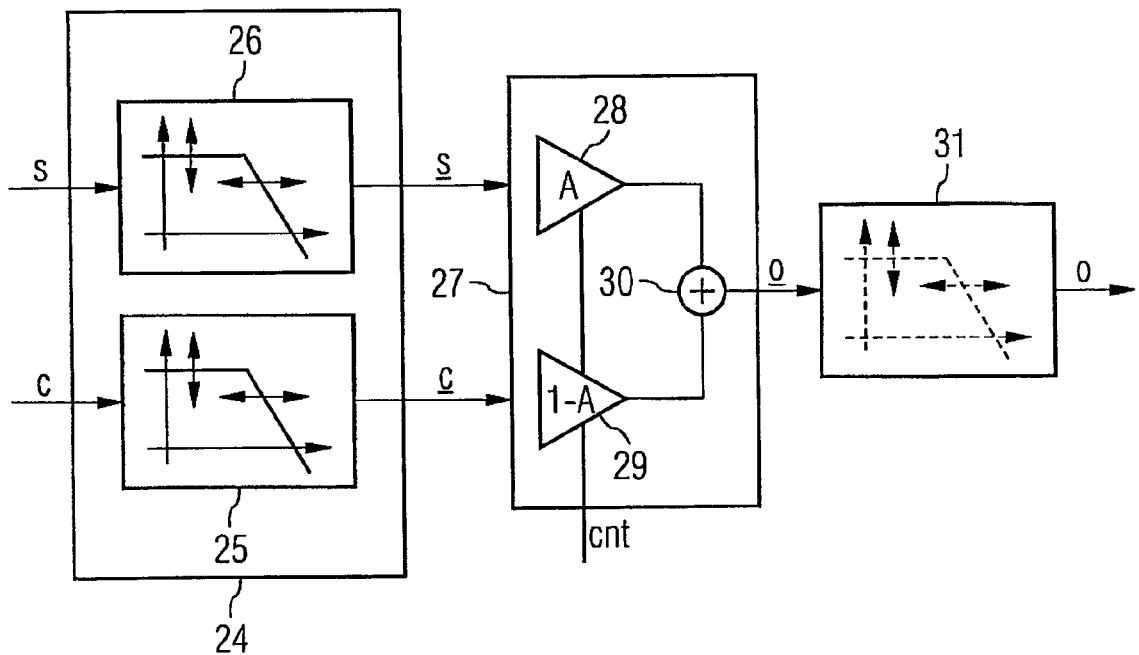
FIG. 9 is a functional block diagram of a conventional phase interpolator with filters for signal shaping.

A first such circuit configuration of the invention is illustrated in FIG. 3. The arrangement illustrated in FIG. 3 serves, like the arrangement of FIG. 1, to generate an output clock signal o with adjustable phase relation from two input clock signals. In contrast to FIG. 1 the input clock signals are in this case difference signals, in which the first input clock signal has components s, s* and the second input clock signal has components c, c*. Similar to the case of conventional phase interpolators from FIG. 8, the input clock signals s, s* and c, c* are fed to difference pairs of transistors T1, T2 and T3, T4. These difference pairs are supplied with current from power sources 10 and 11, in which the magnitude of a current Is of the power source 10 and Ic of the power source 11 is adjusted by a control signal cnt, whereby a weighting of the input clock signals is performed. Preferably this adjustment for regulating or controlling the phase relation of the output signal o takes place in such a way that the sum of the currents Is and Ic remains constant.

The function of the power sources 10, 11 thus corresponds to the function of the blocks 3, 4 from FIG. 1, while the function of the multipliers 5, 6 from FIG. 1 takes place through the interconnection of the power sources 10, 11 with the difference pairs T1, T2 and T3, T4 corresponding to a difference amplifier. In contrast to the transistors T5-T8 of the conventional phase interpolator from FIG. 8 discussed in the introduction to the description, the transistors T1-T4 are designed so that, depending on the voltage values of the signals s, s* and c, c*, the current Is flows either via the transistor T1 or via the transistor T2 and the current Ic flows either via the transistor T3 or via the transistor T4. The function of the sign blocks 1, 2 from FIG. 1 is implemented by this dimensioning of the transistors.

As illustrated in FIG. 3, output connections of the transistors T1 and T3 and T2 and T4 are connected to one another in order to summate corresponding output currents. These output currents are fed to inputs A1 and A2 of a current balancing circuit 12. The current balancing circuit 12 is in addition connected to a supply voltage 18, for example a positive supply voltage. 17 denotes an earth potential.

In the current balancing circuit 12 the currents i, i* corresponding to the summated clock signal i from FIG. 1 are amplified by a factor K, which is chosen depending on requirements of the circuit that is described hereinafter, as regards the amplitudes of the currents. The correspondingly amplified currents are emitted at outputs A3, A4 of the current balancing circuit, in which the amplified current i is emitted at the output A3 and the amplified current i is emitted at the output A4. These amplified currents are integrated at the capacitor Cint, which is connected between the outputs A3 and A4. The capacitor Cint accordingly takes over the function of the integrator 8 from FIG. 1. An integrated summated clock signal ot, ot* can then be tapped as voltage signal at the connections of the capacitor Cint. This difference integrated summated clock signal ot, ot* is fed to an output amplifier 16 corresponding to the amplifier 9 of FIG. 1, in order to generate the output clock signal o. Obviously the output amplifier 16 may also be configured in such a way that instead of generating a single-ended output clock signal o—as illustrated—it generates a difference output clock signal. It is also possible to operate the output amplifier 16 only with the partial signal ot and to amplify this appropriately.

In addition a control unit 15 is provided that evaluates the difference integrated summated clock signal ot, ot* and, depending on the signal ot, ot*, controls current sources 13, 14 that are connected between earth 17 and the connections of the capacitor Cint. In this way an average value of the signal ot, ot* can be adjusted to a desired value, for example to 0. In order to prevent the integrator formed by the capacitor Cint becoming saturated, and in order if necessary to match the level of the signal ot, ot* to the requirements of the output amplifier 16, the amplitudes of the currents released by the current balancing circuit can be adjusted by altering the sum of the currents Is and Ic by a corresponding control of the power sources 10, 11. At the same time the ratio of the currents Is and Ic remains constant in order not to change the phase relation of the output signal o. Obviously this sum can also be fixed beforehand at a value that is tuned to the requirements of the circuit. If the amplification of the current balancing circuit 12 is not required (in other words, K=1), then the simplified circuit configuration of FIG. 4 can be used. The circuit configuration of FIG. 4 corresponds as regards essential parts to that of FIG. 3, and corresponding elements are identified by the same reference numerals. These elements will therefore not be described again.

Figure 4:
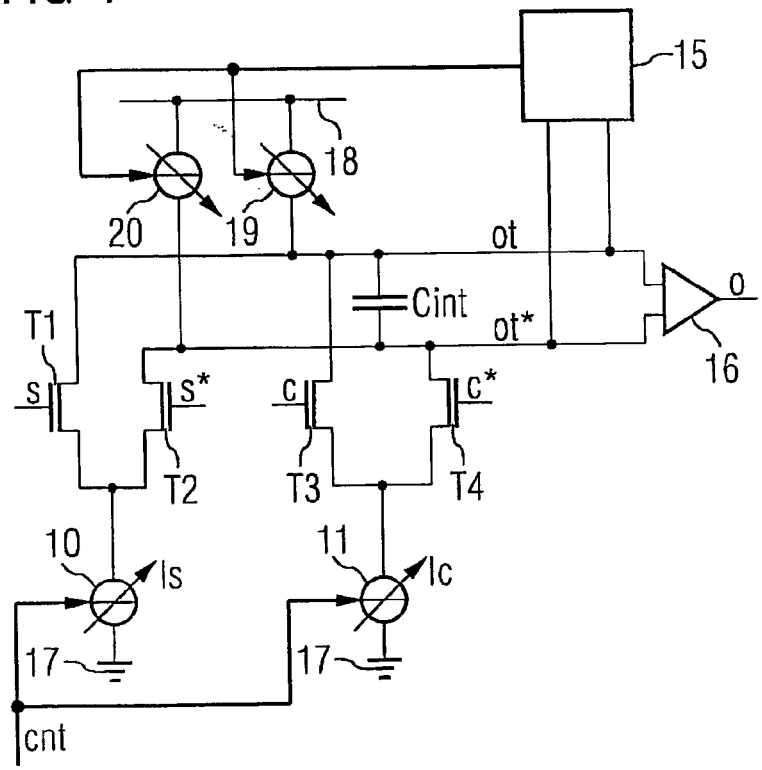
FIG. 4 shows a second circuit configuration of the present invention.
Figure 5:
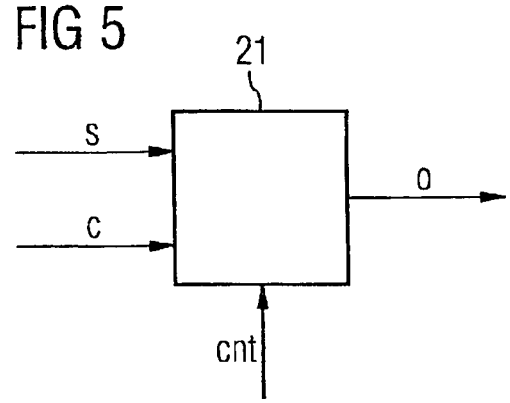
FIG. 5 is a functional block diagram of a phase interpolator.
Figure 6:
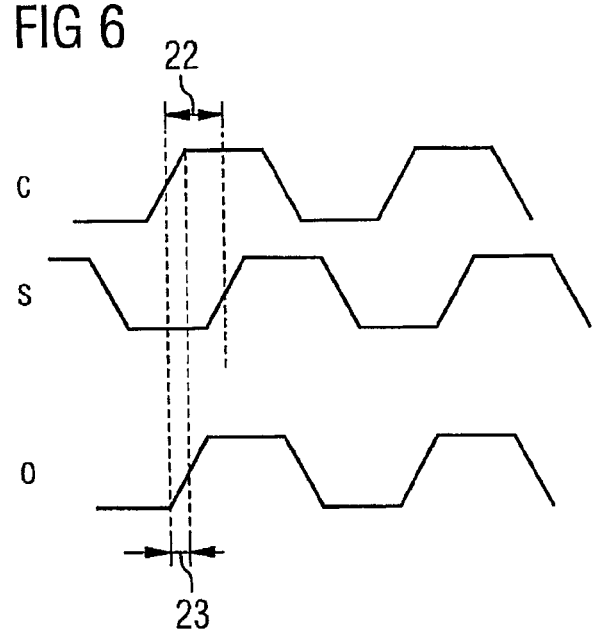
FIG. 6 shows signal progressions in the phase interpolator from FIG. 5.
Figure 7:
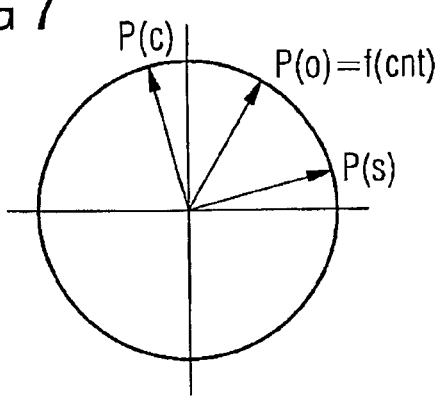
FIG. 7 is a phase-space representation of the signals from FIG. 5.

In contrast to FIG. 3 the added output currents of the difference pair of transistors T1, T2 and T3, T4 are integrated directly at the capacitor Cint. The control unit 15 regulates these currents via power sources 19, 20 that are connected between the difference pair and the supply voltage 18, as illustrated in FIG. 4. This corresponds in principle to the regulation of the currents released by the outputs A3, A4 of the current balancing circuit 12, by means of the power sources 13, 14 of FIG. 3.

Obviously realisations other than those illustrated in FIGS. 3 and 4 are also conceivable, and in particular an integrator other than the capacitor Cint may also be provided. In addition a configuration for single-ended input clock signals s, c is also conceivable. In this case the signals s, c could—with an otherwise identical realisation—be formed for example by inversion of the signals s, c.

It should be noted that the transistors T1-T4 illustrated as NMOS transistors in FIGS. 3 and 4 may in principle also be formed by PMOS transistors or bipolar transistors, or may be replaced by other switching means.

The invention claimed is:

1. A method for generating an output clock signal with adjustable phase relation, comprising:
   a) receiving a plurality of originating input clock signals, the plurality of originating input clock signals being of any one of a plurality of arbitrary waveforms, the plurality of originating input clock signals having a predetermined phase relationship with each other;
   b) forming a plurality of input clock signals having non-arbitrary waveforms from the plurality of originating input signals;
   c) weighting the plurality of input clock signals with respective weighting factors corresponding to a select phase relation;
   d) adding the weighted input clock signals to generate a summation clock signal;
   e) integrating the summation clock signal;
   f) amplifying the integrated summation clock signal such that the output clock signal adopts a saturation value at absolute values of the integrated summated clock signal that are smaller than an absolute value of a maximum value of the integrated summated clock signal; and
   g) generating the output clock signal using the amplified integrated summation clock signal.

2. The method according to claim 1, wherein step f) further comprises amplifying the integrated summation clock signal such that the output clock signal adopts the saturation value at absolute values of the integrated summated clock signal that are greater than 10% of the maximum value of the integrated summated clock signal.

3. The method according to claim 1, wherein the plurality of input clock signals comprises two input clock signals.

4. The method according to claim 1, wherein the plurality of input clock signals comprises four input clock signals.

5. The method according to claim 1, wherein the successive input clock signals are displaced in phase by 90°.

6. The method according to claim 1, wherein the input clock signals are square-wave signals.

7. The method according to claim 1, wherein each of the input clock signals is a differential signal.

8. The method according to claim 1, further comprising:
   forming each of the plurality of input clock signals by amplifying an associated originating input clock signal of the plurality of originating input clock signals.

9. The method according to claim 8, wherein the amplification of the originating input clock signals is carried out such that the input clock signals are substantially square-wave signals.

10. The method according to claim 1, further comprising:
    forming each of the plurality of input clock signals such that the input clock signal is representative of a sign of an amplitude of an associated originating input clock signal.

11. The method according to claim 1, further comprising shifting an amplitude of the output clock signal such that the amplitude has a predetermined mean value.

12. An arrangement for generating an output clock signal with adjustable phase relation from a plurality of input clock signals that have a predetermined phase relationship with each other, the arrangement comprising:

a conversion circuit configured to convert a plurality of originating clock signals into a plurality of square waveform input clock signals, the plurality of originating clock signals having a phased relation to each other and being of any of a plurality of periodic waveform types;

a weighting circuit configured to weight the input clock signals with respective weighting factors corresponding to an adjusted phase relation;

a summing element configured to add the weighted input signals to generate a summation clock signal; and an integrator configured to integrate the summation clock signal, wherein the output clock signal is generated from the integrated summation clock signal; and an amplifier configured to amplify the integrated summation clock signal to generate the output clock signal such that the output clock signal adopts a saturation value at absolute values of the integrated summated clock signal that are smaller than an absolute value of a maximum value of the integrated summated clock signal.

13. The arrangement according to claim 12, wherein the weighting circuit comprises a differential switch pair corresponding to each input clock signal.

14. The arrangement according to claim 13, wherein each differential switch pair includes MOS transistors.

15. The arrangement according to claim 13, wherein each differential switch pair includes bipolar transistors.

16. The arrangement according to claim 12, wherein the summation clock signal is a current signal, and wherein the arrangement further comprises a current balancing circuit configured to provide amplification of the summation clock signal.

17. The arrangement according to claim 12, wherein the integrator comprises a capacitor.

18. The arrangement according to claim 12, further comprising a control device configured to adjust a mean amplitude of the output clock signal.

19. A method for generating an output clock signal with adjustable phase relation, comprising:
   a) forming a plurality of input clock signals by amplifying an associated originating input clock signal of a plurality of originating input clock signals, the plurality of original input clock signals having a predetermined phase relationship with each other;
   b) weighting the plurality of input clock signals with respective weighting factors corresponding to a select phase relation;
   c) adding the weighted input clock signals to generate a summation clock signal;
   d) integrating the summation clock signal; and
   e) generating the output clock signal using the integrated summation clock signal;
   wherein the amplification of the originating input clock signals is carried out such that the input clock signals are substantially square-wave signals; and
   and wherein the amplification of the integrated summation clock signal is carried out such that the output clock signal adopts a saturation value at absolute values of the integrated summated clock signal that are smaller than an absolute value of a maximum value of the integrated summated clock signal.

* * * * *